United States Patent
Hara et al.

[11] Patent Number: 6,123,560
[45] Date of Patent: Sep. 26, 2000

[54] EJECTION MECHANISM OF ELECTRONIC CARD CONNECTOR

[75] Inventors: Tomohisa Hara; Yoshitsugu Koseki, both of Nagono, Japan

[73] Assignee: Hon Hai Precision Ind. Co., Ltd., Taipei Hsien, Taiwan

[21] Appl. No.: 09/366,191

[22] Filed: Aug. 3, 1999

[30] Foreign Application Priority Data

Dec. 31, 1998 [TW] Taiwan ................................ 87222047

[51] Int. Cl.$^7$ ................................................ H01B 13/62
[52] U.S. Cl. ............................................................ 439/159
[58] Field of Search ................................. 439/152–157, 439/159, 160

[56] References Cited

U.S. PATENT DOCUMENTS

| | | | |
|---|---|---|---|
| 5,290,174 | 3/1994 | Woratyla et al. | 439/377 |
| 5,324,204 | 6/1994 | Lwee | 439/159 |
| 5,507,658 | 4/1996 | Ho | 439/159 |
| 5,558,527 | 9/1996 | Lin | 439/159 |
| 5,695,351 | 12/1997 | Kimura et al. | 439/159 |

*Primary Examiner*—Gary F. Paumen
*Attorney, Agent, or Firm*—Wei Te Chung

[57] ABSTRACT

An electronic card connector includes an insulative header retaining conductive contacts for electrically engaging an electronic card received therein. A card ejection mechanism is mounted to the header for selectively ejecting the electronic card from the connector. The ejection mechanism includes a casing retaining a cam plate therein. A push bar is slidably arranged between the cam plate and the casing with an end thereof extending beyond the connector for facilitating manual actuation. A slot is defined in the push bar for receiving a slider therein. The slot drivingly engages with an end of a coupling bar which is coupled to the card driving member. The slider forms a pin movably and guidingly received in a groove defined in the cam plate and forming a closed loop path. A lock plate has a resilient locking section having a free end biased into a notch defined in one side wall of the slot for engaging therewith and preventing the push bar from moving with respect to the cam plate thereby fixing the push bar. A passage is defined between the lock plate and the push bar for movably receiving the end of the coupling bar whereby when an electronic card is inserted into the connector, the coupling bar is moved and the end thereof engages with the locking section of the lock plate to force the free end thereof out of the notch thereby freeing the push bar.

10 Claims, 5 Drawing Sheets

EJECTION MECHANISM OF ELECTRONIC CARD CONNECTOR

BACKGROUND OF THE INVENTION

1. Field of the Invention

The present invention generally relates to an electronic card connector having a card ejection mechanism, and in particular to a card ejection mechanism having a locking device.

2. The Prior Art

Electronic cards, such as Personal Computer Memory Card International Association (PCMCIA) cards and flash memory cards, are widely used for expanding resources of a computer or a consumer electronic device. An electronic card connector is incorporated in a computer or consumer electronic device to connect an electronic card therewith. The electronic card connector is equipped with a card ejection mechanism for selectively ejecting an electronic card from the connector. Examples of electronic card connectors are disclosed in Taiwan Patent Application Nos. 80207449, 81216447, 81217278, 82211746, 83111731, and 85103753 and U.S. Pat. Nos. 5,290,174, 5,324,204 and 5,507,658.

FIG. 1 of the attached drawings shows a conventional electronic card connector 6 comprising an insulative header 60 retaining conductive contacts 603 therein and a shielding member 61 for shielding the contacts 603. Two projections 602 extend from opposite ends of the header 60 and define a card receiving space 601 therebetween for receiving an electronic card (not shown). A card ejection mechanism 5 comprises a plate 53 mounted to the header 60 and two guide arms 50 extending therefrom corresponding to the projections 602 of the header 60. A push bar 54 is slidably mounted to one of the guide arms 50 and has a knob 501 fixed to a free end thereof for manual actuation thereby moving the push bar 54 from an outer position to an inner position. A card ejection member 51 is coupled to the push bar 54 by means of a rocking member 52. The movement of the push bar 54 from the outer position to the inner position drives the card ejection member 51 to move between the guide arms 50 thereby ejecting the electronic card out of the connector 6.

The knob 501 of the push bar 54 is located outside the connector 6 for facilitating manual actuation. Since the knob 501 is exposed, it may be easily damaged due to undesired collision thereof with other objects. A push-push type ejection mechanism overcomes such a problem. The push-push ejection mechanism temporarily fixes the push bar at the inner position after a first push thereof for partially enclosing the push bar 54 inside the connector 6 thereby reducing the chance of collision. A second push of the push bar 54 releases the push bar 54 from the fixed, inner position for allowing manual operation of the push bar.

A disadvantage of the conventional push-push type ejection mechanism is that inadvertent contact of the knob may undesirably release the push bar from the inner position. It is thus desired to provide an ejection mechanism having a locking device to alleviate the problem discussed above.

SUMMARY OF THE INVENTION

Accordingly, an object of the present invention is to provide a card ejection mechanism of an electronic card connector having a locking device for preventing the ejection mechanism from being inadvertently actuated to release a push bar thereof.

Another object of the present invention is to provide an electronic card connector having a push-push type ejection mechanism which is secured after ejection of an electronic card.

A further object of the present invention is to provide an electronic card connector having a push-push type ejection mechanism which is operable only when an electronic card is inserted in the connector.

In accordance with the present invention, an electronic card connector comprises an insulative header retaining conductive contacts for electrically engaging an electronic card received therein. A card ejection mechanism is mounted to the header for selectively ejecting the electronic card from the connector. The ejection mechanism comprises a casing retaining a cam plate therein. A push bar is slidably arranged between the cam plate and the casing with an end thereof extending beyond the connector for facilitating manual actuation. A slot is defined in the push bar for receiving a slider therein. The slider drivingly engages with an end of a coupling bar which is coupled to the card driving member. The slider forms a pin movably and guidingly received in a groove defined in the cam plate and forming a closed loop path. A lock plate, serving as a locking device of the ejection mechanism, comprises a resilient locking section having a free end biased into a notch defined in one side wall of the slot for engaging therewith and preventing the push bar from moving with respect to the cam plate thereby fixing the push bar. A passage is defined between the lock plate and the push bar for movably receiving the end of the coupling bar whereby when an electronic card is inserted into the connector, the coupling bar is moved and the end thereof engages with the locking section of the lock plate to force the free end thereof out of the notch thereby freeing the push bar.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
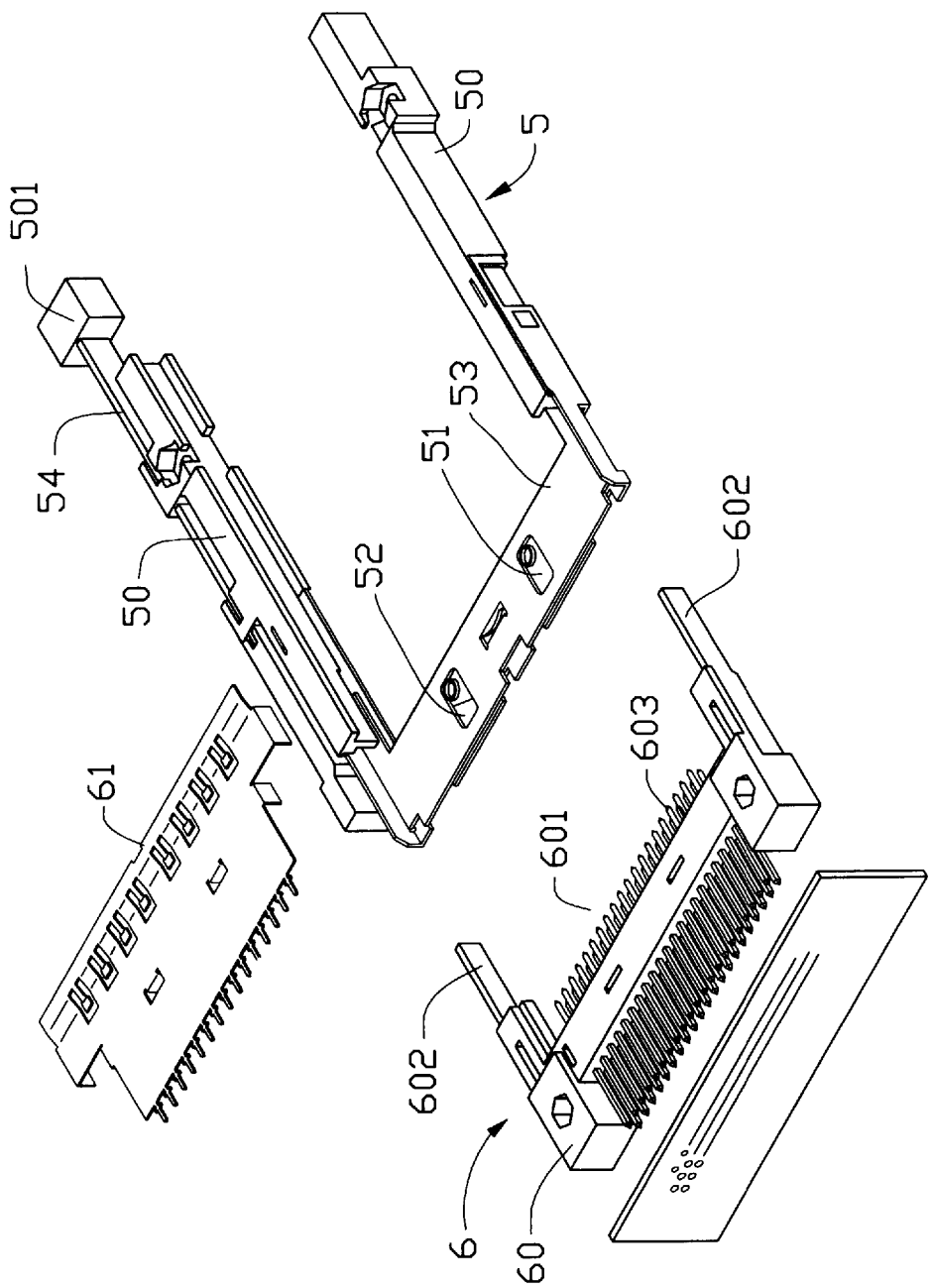
FIG. 1 is an exploded view of a conventional electronic card connector.
Figure 2:
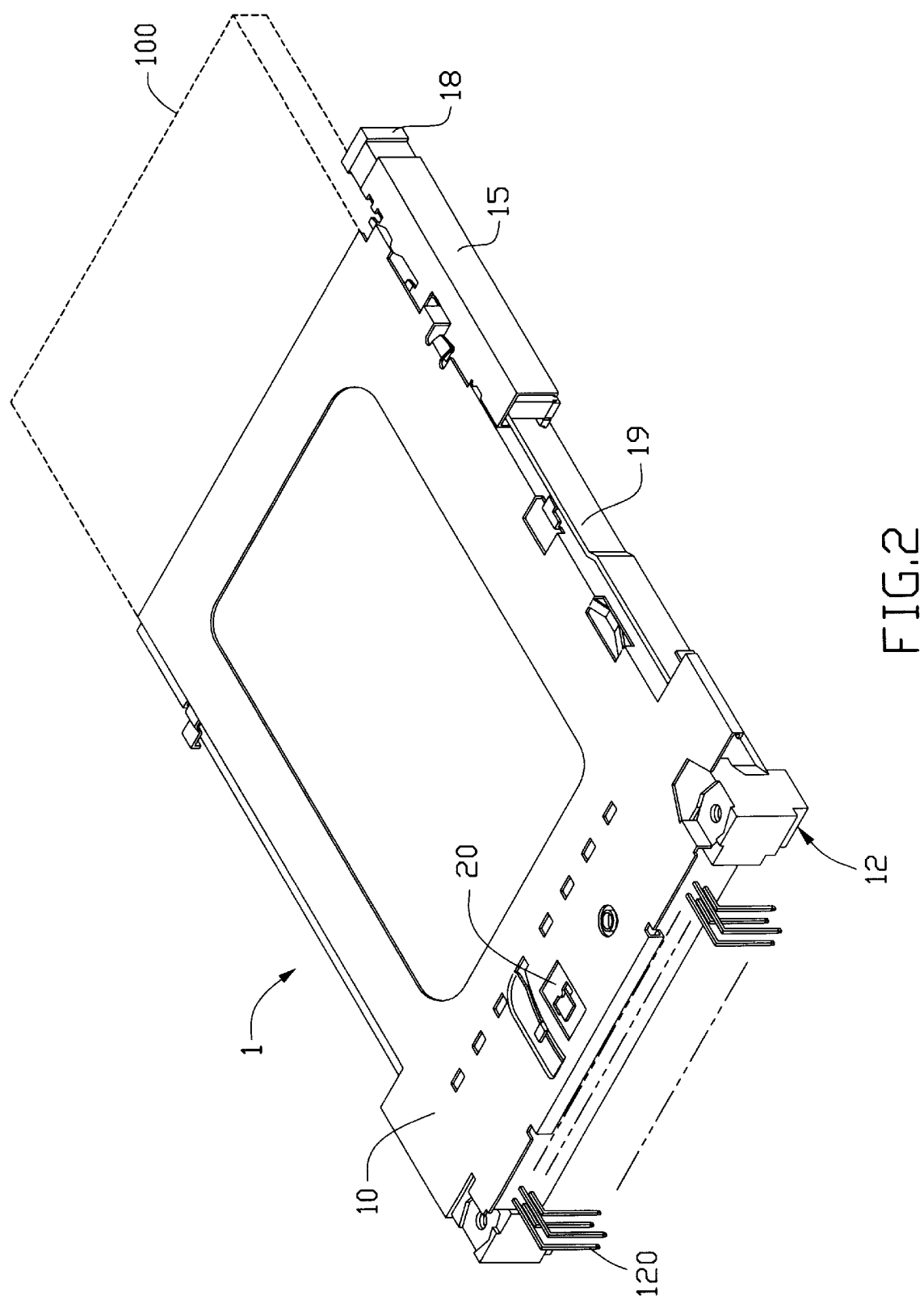
FIG. 2 is a perspective view of an electronic card connector constructed in accordance with the present invention.

Referring to the drawings and in particular to FIG. 2, an electronic card connector 1 in accordance with the present invention comprises an insulative header 12 retaining conductive contacts 120 for electrically engaging with an electronic card 100 inserted into the electronic card connector 1. A shielding member 10 is mounted on the header 12 for electrically and mechanically shielding the connector 1. A card ejection mechanism 15 is attached to the shielding member 10 for being manually operated to eject the electronic card 100 from the electronic card connector 1. A card driving member 20 is movably supported between the header 12 and the shielding member 10 and is drivingly coupled to the card ejection mechanism 15 by means of a movable coupling bar 19 whereby when the card ejection mechanism 15 is actuated, the card driving member 20 is moved to force the electronic card 100 out of the electronic card connector 1.

Figure 3:
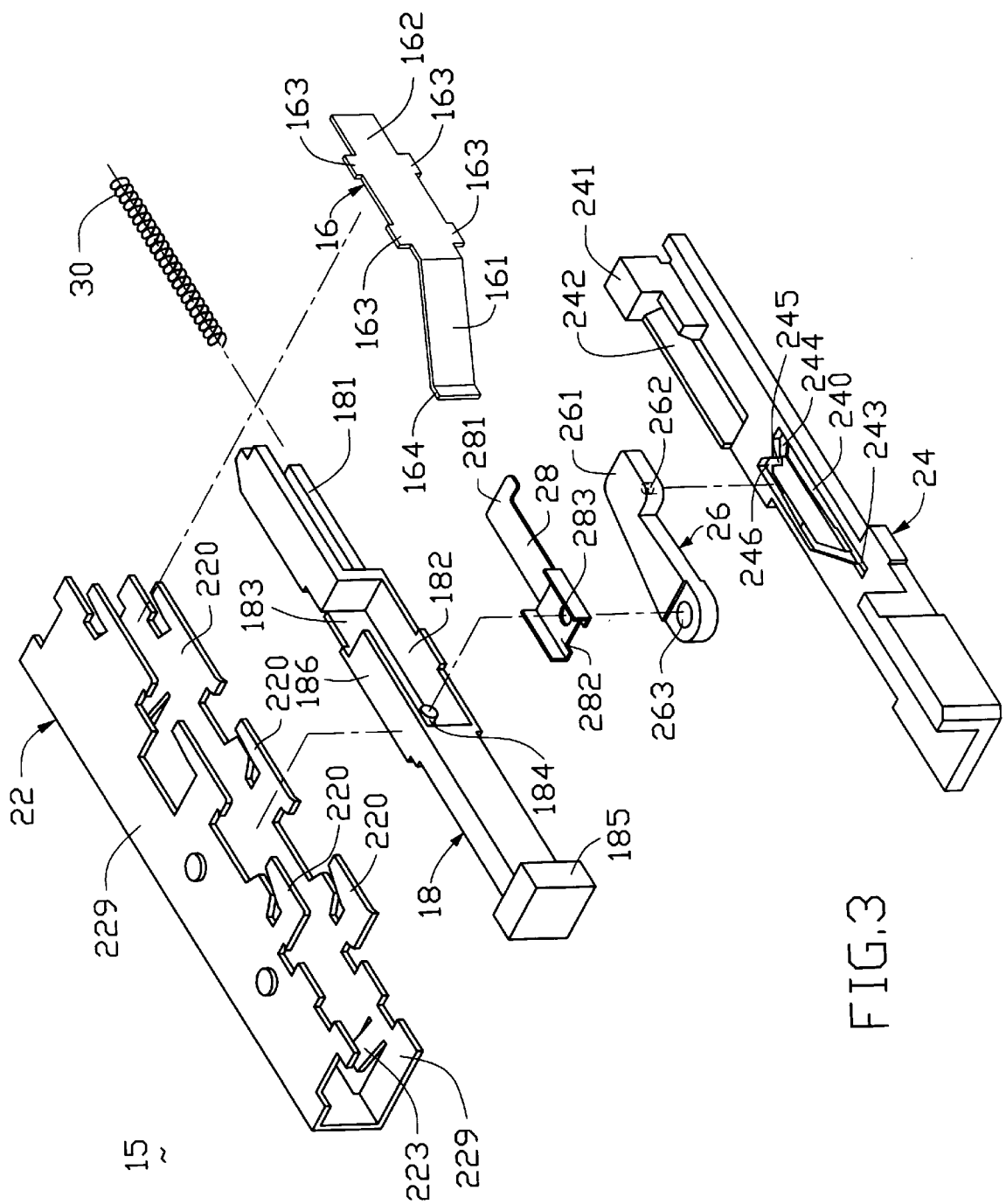
FIG. 3 is an exploded view of a card ejection mechanism of the electronic card connector of the present invention.
Figure 4:
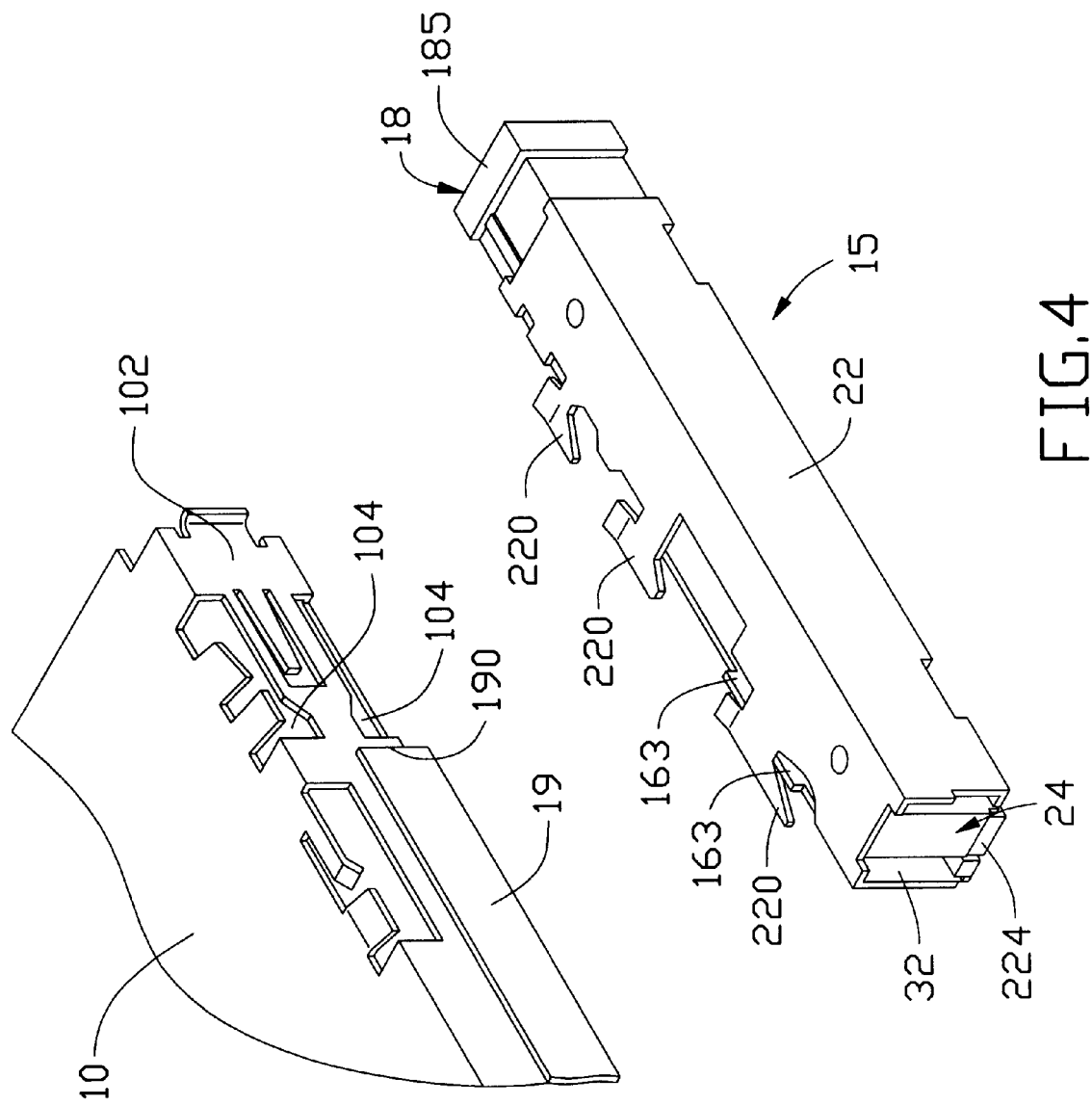
FIG. 4 is a perspective view of the card ejection mechanism detached from the electronic card connector.

Referring also to FIGS. 3 and 4, the card ejection mechanism 15 comprises a casing 22 defining a channel between opposite side walls 229 thereof. The side walls 229 form latching projections 220 on free edges thereof for engaging with corresponding openings 104 defined in a side flange 102 of the shielding member 10 thereby retaining the casing 22 on the shielding member 10.

A cam plate 24 is received and fixed in the casing 22 by being engaged by barbs 223 formed on at least one side wall 229 of the casing 22. A retaining block 224 (FIG. 4) formed on one end of the cam plate 24 engages with a corresponding notch (not labeled) defined in the casing 22 for further securing the cam plate 24 to the casing 22.

A push bar 18 is received between the casing 22 and the cam plate 24 and is movable between an outer, ready-to-push position and an inner, stowed position. The push bar 18 has a first end 185 extending beyond the casing 22 for facilitating manual actuation and a second end forming an extension 181 to be inserted into a helical spring 30 for retaining the spring 30 in position. The spring 30 has a remote end (not labeled) abutting against an end block 241 of the cam plate 24 for providing a biasing force between the cam plate 24 and the push bar 18. A slot 242 may be formed in the cam plate 24 for partially accommodating the spring 30.

A slot 182 is defined in the push bar 18 for movably receiving a slider 26 therein. The slider 26 defines a hole 263 for receiving a trunnion 184 formed in the slot 182 of the push bar 18 for pivotally attaching the slider 26 to the push bar 18. The slider 26 forms a pin 262 movably and guidingly received in a guide groove 240 defined in the cam plate 24. The guide groove 240 forms a closed-loop path along which the pin 262 of the slider 26 may move. A biasing element 28 is received in the slot 182 and interposed between the slider 26 and the push bar 18 for biasing the slider 26 toward the cam plate 14 and retaining the pin 262 in the guide groove 240. In the embodiment shown, the biasing element 28 is a leaf spring having a U-shaped fixing section 282 received and retained in the slot 182 and a protrusion 281 for retaining the pin 262 in the guiding groove 40. A hole 283 is defined in the fixing section 282 for the extension of the trunnion 184.

The slider 26 forms a transverse projection 261 for contacting and drivingly engaging an end 190 of the coupling bar 19 to eject the electronic card 100 out of the electronic card connector 1.

Figure 5A:
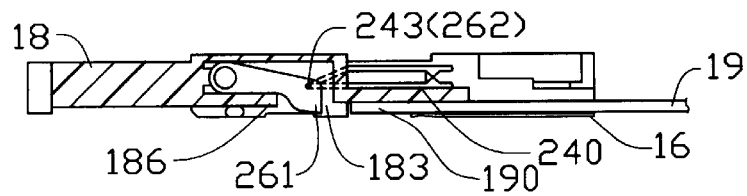
FIGS. 5A–5F are sequential, cross-sectional views showing operation of the card ejection mechanism of the electronic card connector.
Figure 5B:
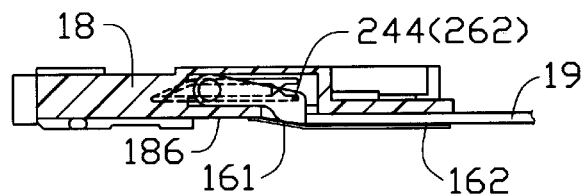
Figure 5C:
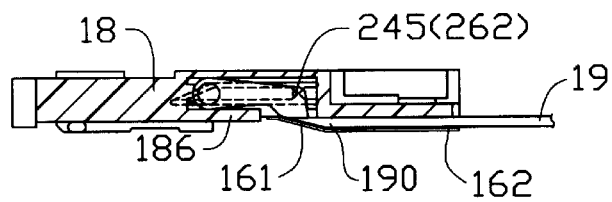

Also referring to FIGS. 5A–5F, the guide groove 240 has first, second, third, and fourth points 243, 244, 245, 246 positioned therealong and being of different depths. A first push of the push bar 18 moves the push bar 18 from the outer ready-to-push position toward the inner stowed position thereby causing the pin 262 of the slider 26 to move from the first point 243 (FIG. 5A) to the second point 244 (FIG. 5B) whereby the spring 30 is compressed. The coupling bar 19 is driven by the transverse projection 261 of the slider 26 to move inward and eject the electronic card 100 out of the electronic card connector 1. When the pushing force is removed, the biasing force of the spring 30 dominates and drives the pin 262 of the slider 26 to the third point 245 (FIG. 5C). The pin 262 is retained at the third point 245 and the slider 26 and the push bar 18 are fixed and locked at the stowed position inside the casing 22. A second push of the push bar 18 against the spring 30 moves the pin 262 from the third point 245 to the fourth point 246 (FIG. 5E) and once the pushing force is removed, the pin 262 is driven by the biasing force of the spring 30 to move back to the first point 243 (FIG. 5F) whereby the push bar 18 is moved to the outer ready-to-push position for the next ejection operation.

Referring back to FIG. 3, the ejection mechanism 15 further comprises a locking device including a lock plate 16 having a base section 162 forming four tabs 163 on opposite longitudinal edges thereof for engaging with the corresponding latching projections 220 of the casing 22 thereby fixing the lock plate 16 to the casing 22. A passage 32 is defined between the base section 162 of the lock plate 16 and the cam plate 24 for movably receiving the end 190 of the coupling bar 19 as shown in FIG. 4. The end 190 of the coupling bar 19 received in the passage 32 is engageable with and driven by the transverse projection 261 as discussed above.

The lock plate 16 comprises a resilient locking section 161 extending from the base section 162. The resiliency of the locking section 161 urges a free end 164 thereof into a notch 183 defined in a side wall 186 of the push bar 18 for contacting a lateral edge of the side wall 186 thereby stopping movement of the push bar 18 to prevent the push bar 18 from being inadvertently actuated and released from the stowed position.

The coupling bar 19 is movable with respect to the locking section 161 of the lock plate 16 whereby when the coupling bar 19 is moved outward, the end 190 thereof is brought into engagement with and deforms the locking section 161 to force the free end 164 out of the notch 183.

As shown in FIG. 5C, when the pin 262 moves to the third point 245 of the guide groove 240, the free end 164 of the locking section 161 of the lock plate 16 enters the notch 183 whereby a second push attempting to move the pin 262 from the third point 245 to the fourth point 246 for releasing the push bar 18 from the stowed position is prevented due to engagement between the free end 164 of the lock plate 16 and the lateral edge of the side wall 186 of the push bar 18. The push bar 18 is thus locked in the stowed position.

Figure 5D:
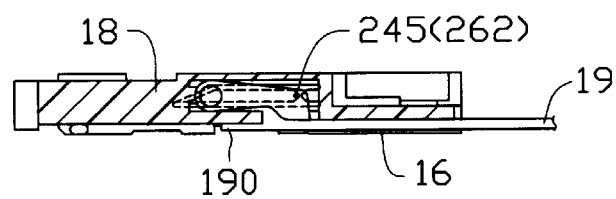
Figure 5E:
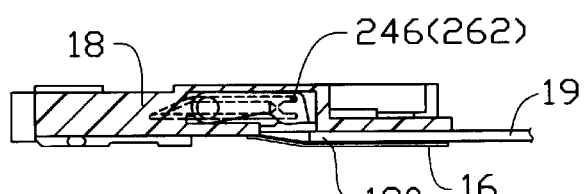
Figure 5F:
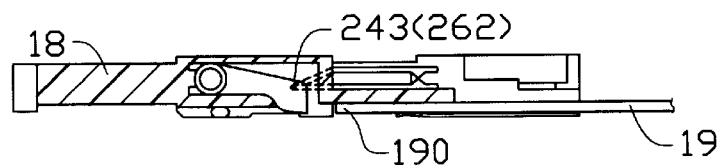

When an electronic card is inserted into the connector 1, the coupling bar 19 is moved outward. The end 190 of the coupling bar 19 engages with the locking section 161 of the lock bar 16 and forces the free end 164 thereof out of the notch 183 as shown in FIG. 5D thereby allowing a second push to be carried out whereby the push bar 18 is released from the stowed position and moves back to the outer ready-to-push position for next ejection operation.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An ejection mechanism of an electronic card connector, the electronic card connector defining a space for receiving an electronic card and comprising a card driving member movable therein for ejecting the electronic card from the connector, the ejection mechanism comprising:

a casing mounted to the connector and defining a channel;

a cam plate fixed in the channel, a guide groove being defined in the cam plate for forming a closed loop path having an outer point and an inner point;

a push bar movably received in the channel and defining a slot therein having at least one side wall, a notch being defined in the side wall for forming a lateral edge of the side wall;

a slider received in the slot of the push bar and having a pin movably received in the guide groove whereby when the pin moves along the path from the outer point to the inner point, the push bar is moved from an outer ready-to-push position to an inner stowed position, the slider having a transverse projection drivingly engaging with an end of a movable bar coupled to the card driving member whereby when the push bar is moved to the stowed position, the movable bar drives the card driving member to eject the electronic card; and a lock plate fixed in the channel of the casing and having a resilient locking section with a free end extending into the notch for engaging with the lateral edge of the side wall of the push bar to secure the push bar at the stowed position, the lock plate defining a passage with the cam plate for movably receiving the end of the movable bar, the movable bar being moved outward when an electronic card is inserted into the connector whereby the end of the movable bar engages with the resilient section of the lock plate and forces the free end thereof out of the notch for releasing the push bar from the stowed position to the ready-to-push position.

2. The ejection mechanism as claimed in claim 1, wherein the closed loop path comprises a forward segment and a backward segment, the forward segment extending from the outer point through a first intermediate point to the inner point, the backward segment extending from the inner point through a second intermediate point to the outer point, the first and second intermediate points being located at positions further away from the outer point than the inner point thereby forming a trapping position at the inner point for the pin of the slider.

3. The ejection mechanism as claimed in claim 2, wherein biasing means is arranged between the cam plate and the push bar for applying a biasing force on the push bar in the outward direction to secure the pin of the slider at the trapping position.

4. The ejection mechanism as claimed in claim 1, wherein biasing means is arranged between the slider and the push bar for biasing the slider toward the cam plate and retaining the pin of the slider in the guide groove.

5. The ejection mechanism as claimed in claim 2, wherein the slider is pivotally fixed in the slot of the push bar for allowing the pin thereof to be guided along the forward and backward segments of the guide groove.

6. An electrical connector comprising:

an insulative header retaining conductive contacts and defining a space adapted to receive an electronic card;

a card driving member movably supported on the header for selectively driving the electronic card out of the connector;

a movable bar coupled to the card driving member; and an ejection mechanism manually operable to actuate the movable bar for driving the card driving member, the ejection mechanism comprising:

a casing mounted to the connector and defining a channel;

a cam plate fixed in the channel, a guide groove being defined in the cam plate for forming a closed loop path having an outer point and an inner point;

a push bar movably received in the channel and defining a slot therein having at least one side wall, a notch being defined in the side wall for forming a lateral edge of the side wall;

a slider received in the slot of the push bar and having a pin movably received in the guide groove whereby when the pin moves from the outer point to the inner point, the push bar is moved from an outer ready-to-push position to an inner stowed position, the slider having a transverse projection drivingly engaging with an end of a movable bar coupled to the card driving member whereby when the push bar is moved to the stowed position, the movable bar drives the card driving member to eject the electronic card; and a lock plate fixed in the channel of the casing and having a resilient locking section with a free end extending into the notch for engaging with the lateral edge of the side wall of the push bar to secure the push bar at the stowed position, the lock plate defining a passage with the cam plate for movably receiving the end of the movable bar, the movable bar being moved outward when an electronic card is inserted into the connector whereby the end of the movable bar engages with the resilient section of the lock plate and forces the free end thereof out of the notch for releasing the push bar from the stowed position to the ready-to-push position.

7. The electronic card connector as claimed in claim 6, wherein the closed loop path comprises a forward segment and a backward segment, the forward segment extending from the outer point through a first intermediate point to the inner point, the backward segment extending from the inner point through a second intermediate point to the outer point, the first and second intermediate points being located at positions further away from the outer point than the inner point thereby forming a trapping position at the inner point for the pin of the slider.

8. The electronic card connector as claimed in claim 7, wherein biasing means is arranged between the cam plate and the push bar for applying a biasing force to the push bar in the outward direction for securing the pin of the slider at the trapping position.

9. The electronic card connector as claimed in claim 6, wherein biasing means is arranged between the slider and the push bar for biasing the slider toward the cam plate and retaining the pin of the slider in the guide groove.

10. The electronic card connector as claimed in claim 7, wherein the slider is pivotally fixed in the slot of the push bar for allowing the pin thereof to be guided along the forward and backward segments of the guide groove.

* * * * *